United States Patent [19]

Kanai

[11] 4,410,816
[45] Oct. 18, 1983

[54] ECL INTEGRATED CIRCUIT

[75] Inventor: Yasunori Kanai, Inagi, Japan

[73] Assignee: Fujitsu Limited, Kawasaki, Japan

[21] Appl. No.: 327,692

[22] Filed: Dec. 4, 1981

[30] Foreign Application Priority Data

Dec. 25, 1980 [JP] Japan .............................. 55-184563

[51] Int. Cl.³ .................. H03K 19/003; H03K 19/086
[52] U.S. Cl. .................................... 307/455; 307/443;
324/73 R
[58] Field of Search .............. 307/443, 455, 467, 480;
324/73 R, 73 AT, 73 PC, 158 T

[56] References Cited

U.S. PATENT DOCUMENTS 4,074,188 2/1978 Boatman et al. ............... 324/73 PC
4,156,819 5/1979 Takahashi et al. ............... 324/73 R Primary Examiner—John Zazworsky
Attorney, Agent, or Firm—Staas & Halsey

[57] ABSTRACT

An ECL integrated circuit comprises an emitter-follower transistor at the output stage and a pull-down resistor connected to the emitter-follower transistor. The ECL integrated circuit is provided with a test circuit on a line extending from the output of emitter-follower transistor to a subsequent stage so as to cause a test current to flow only at the time of the test. The test current is smaller than the current usually flowing to the pull-down resistor but larger than the current flowing to the subsequent stage.

9 Claims, 12 Drawing Figures

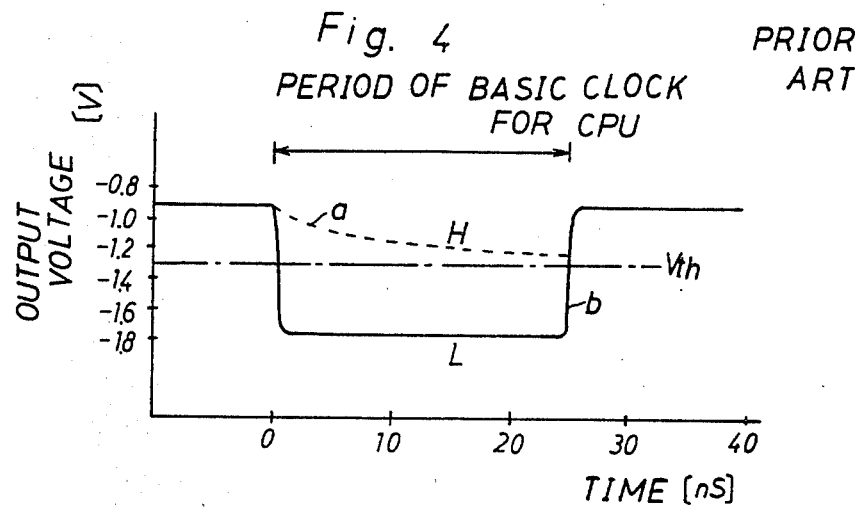
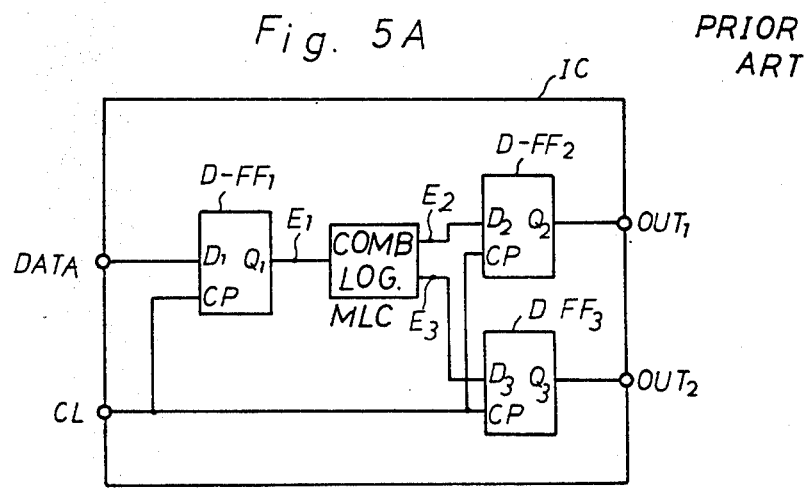
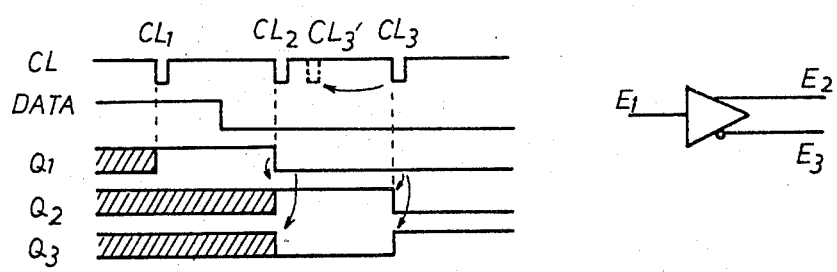

ECL INTEGRATED CIRCUIT

BACKGROUND OF THE INVENTION (1) Field of the Invention

The present invention relates to an ECL (Emitter Coupled Logic) integrated circuit including a plurality of ECL circuits each comprising an emitter-follower transistor at the output stage and a pull-down resistor connected to the emitter-follower transistor and, more particularly, to a testing circuit capable of detecting a poor dynamic function in a ECL circuit by means of a low repetition frequency.

(2) Description of the Prior Art

The prior art will be described with reference to the following drawings.

FIG. 1 is a circuit diagram showing an emitter-follower circuit at the output stage of an ECL circuit;

FIG. 2 is a graph of the input characteristics of a conventional ECL circuit;

FIGS. 3 and 4 are graphs showing the response characteristics of an ECL circuit output in response to different repetition frequencies; and FIG. 5A is a schematic diagram of an ECL integrated circuit, FIG. 5B is a time chart for the circuit of FIG. 5A, and FIG. 5C is a diagram of an example of the combination logic circuit in FIG. 5A;

The fundamental element of an ECL circuit is an ECL gate in which emitters of a pair of transistors are connected to each other and a reference voltage is applied to the base of one of transistors, with an input being applied to the base of the other transistor. The ECL circuit often picks up output OUT through an EF (emitter-follower) transistor $Q_{EF}$ shown in FIG. 1. Namely, a base input of EF transistor $Q_{EF}$ is a collector output of an ECL gate (not shown). The output stage of this ECL circuit comprises connecting the emitter of transistor $Q_{EF}$ to an appropriate voltage $V_T$ through a pull-down resistor $R_T$. If the connection between the emitter of transistor $Q_{EF}$ and the resistor $R_T$ is cut at a point A, for example, in such circuit, the arrangement of resistor $R_T$ becomes meaningless. This accident is caused when the contact window for the resistor $R_T$ is not opened, when the pattern of the resistor $R_T$ is broken or when the wiring is broken.

Accidents of this type are usually detected by a dynamic function test using a predetermined repetition frequency. However, when the repetition frequency is low, the poor dynamic function of the circuit cannot be detected sometimes. Usually an ECL circuit has the input characteristic shown in FIG. 2 and an H (high) level can be distinguished from an L level with a threshold voltage Vth of about −1.3 V interposed therebetween ($P_H$ represents a point at which H operation is usually carried out and $P_L$ a point at which L operation is usually carried out). The cut of connection at point A is detected when the level of the output OUT does not drop lower than a certain voltage. This is natural when the emitter of transistor $Q_{EF}$ shown in FIG. 1 is kept open. However, the emitter is usually arranged inside an integrated circuit IC (for example, a combination logic circuit MLC) as shown in FIG. 5A, and outputs $OUT_1$ and $OUT_2$, relating to test data DATA, are picked up through the multiple stages (D-$FF_1$, D-$FF_2$ and D-$FF_3$ in FIG. 5A) of this ECL circuit. In order to enable the cut of connection at point A in FIG. 1 to be detected according to the function test of an ECL integrated circuit, it is therefore necessary to meet the condition that the output OUT of transistor $Q_{EF}$ at the previous stage does not drop lower than the threshold voltage Vth of the ECL circuit at a subsequent stage.

However, the level of the output OUT at the previous stage, having a connection cut at point A, is influenced by input current applied to the ECL circuits at the subsequent stage (as shown in FIG. 2) and drops, as time passes, lower than the threshold voltage Vth as shown by a broken line (a) in FIG. 3. This occurs when the cycle of test is too long, as shown in FIG. 3, that is, when the repetition frequency is low (f=2 MHz). A solid line (b) represents the voltage of the output OUT under the condition that the resistor $R_T$ is correctly connected without any cut at point A. If the input of transistor $Q_{EF}$ is at the H level, the output OUT thereof is also kept at the H level and information indicating the cut of the connection at point A is not practically transmitted to the subsequent stage. Thus, the cut of connection at point A cannot be detected from outputs $OUT_1$ and $OUT_2$ according to the test in which low repetition frequency is employed. At the point $P_1$ in FIG. 2 the input voltage (corresponding to the broken line (a) in FIG. 3) is reduced to the minimum potential which is lower than Vth by input current applied to the subsequent stage.

FIG. 4 shows the waveform obtained when operation is carried out using the fundamental clock (f=40 MHz) of a current ultralarge-scale electronic computer (CPU), and the broken and solid lines (a) and (b) in FIG. 4 correspond to those in FIG. 3, respectively. The level of the output OUT in FIG. 1 does not drop very much within a short time period, thus a voltage larger than Vth at high repetition frequency of f=40 MHz is required. Therefore, even if the dynamic function of an ECL circuit whose connection is cut at point A in FIG. 1 is found good by the test in which a low repetition frequency of f=2 MHz is employed, a malfunction in the ECL circuit is found when a high repetition frequency of f=40 MHz is employed.

The repetition frequency employed in a tester may be increased to overcome this problem, but the fundamental clock of the ultra-large-sized electronic computer of the future is expected to have a high frequency of about 100-200 MHz. When a tester which can cover such a computer cannot be obtained, it is impossible to carry out a satisfactory dynamic function test (the repetition frequency which is now employed as the test frequency ranges from 10 MHz to 20 MHz at maximum and the test frequency employed by the trial testers which are now manufactured ranges from 50 MHz to 100 MHz).

FIG. 5B is a time chart showing the operation of the ECL integrated circuit shown in FIG. 5A by outputs Q1–Q3 of D-type flip-flops D-FF1, D-FF2 and D-FF3, clock CL, and input data DATA. The flip-flop D-FF1 takes on the value of input data DATA e.g. H level response to a first clock CL1. If the combination logic circuit MLC is a buffer/inverter circuit shown in FIG. 5C, for example, the flip-flop D-FF1 takes on L level in response to a next clock CL2 while flip-flops D-FF2 and D-FF3 provide outputs E2 and E3 of the combination logic circuit MLC, e.g. output data H and L of buffer/inverter circuit, respectively. Namely, H and L levels are taken in by flip-flops D-FF2 and D-FF3. Flip-flops D-FF2 and D-FF3 take on the outputs E2 and E3 of the combination logic circuit MLC, respectively, response to a subsequent clock CL3. When clock CL is at a low frequency, any accident or the influence of disconnection of a pull-down resistor, for example, has no effect. However, when the clock becomes high in frequency, that is, when a clock is applied at the position of CL3', for example, the outputs obtained are different from those obtained in the case of clock CL3, as shown in FIG. 4. When the disconnection of a resistor is at a common portion of a buffer/inverter circuit, for example, outputs Q2 and Q3 of flip-flops D-FF2 and D-FF3 show no change at the clock CL3'.

SUMMARY OF THE INVENTION

It is an object of the present invention to detect the wrong dynamic function of an ECL circuit using a low repetition frequency.

The ECL integrated circuit of the present invention includes a plurality of ECL circuits each comprising an emitter-follower transistor at the output stage and a pull-down resistor connected to the emitter-follower transistor. A testing circuit to which auxiliary current, having a value smaller than the current usually flowing to the pull-down resistor but larger than the input current of the subsequent stage, is allowed to flow only at the time of test, is arranged on a line through which the output of each emitter-follower transistor is directed to the subsequent stage.

BRIEF DESCRIPTION OF THE DRAWINGS

FIGS. 3 and 4 are graphs of the response characteristics of the ECL circuit output in response to different repetition frequencies; and FIG. 5A is a schematic diagram of an ECL integrated circuit;

FIG. 5B is a time chart for the circuit of FIG. 5A;

FIG. 5C is a diagram of an example of the combination logic circuit in FIG. 5A;

DETAILED DESCRIPTION OF THE PREFERRED EMBODIMENTS

Figure 1:
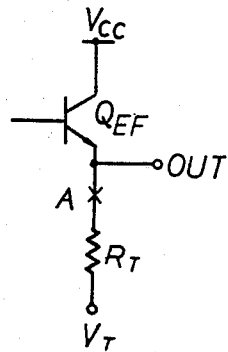
FIG. 1 is a circuit diagram of a prior art emitter-follower circuit for the output stage of an ECL circuit.
Figure 2:
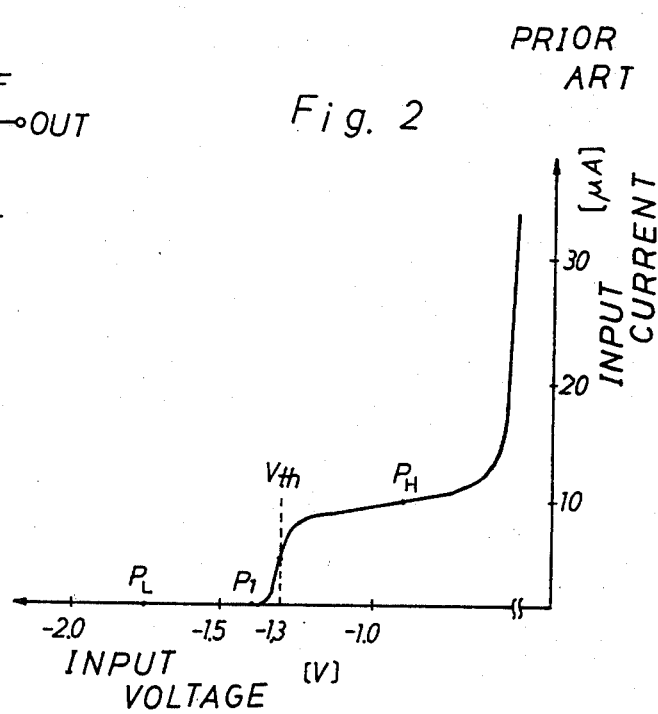
FIG. 2 is a graph of the input characteristics of a prior art ECL circuit.
Figure 6:
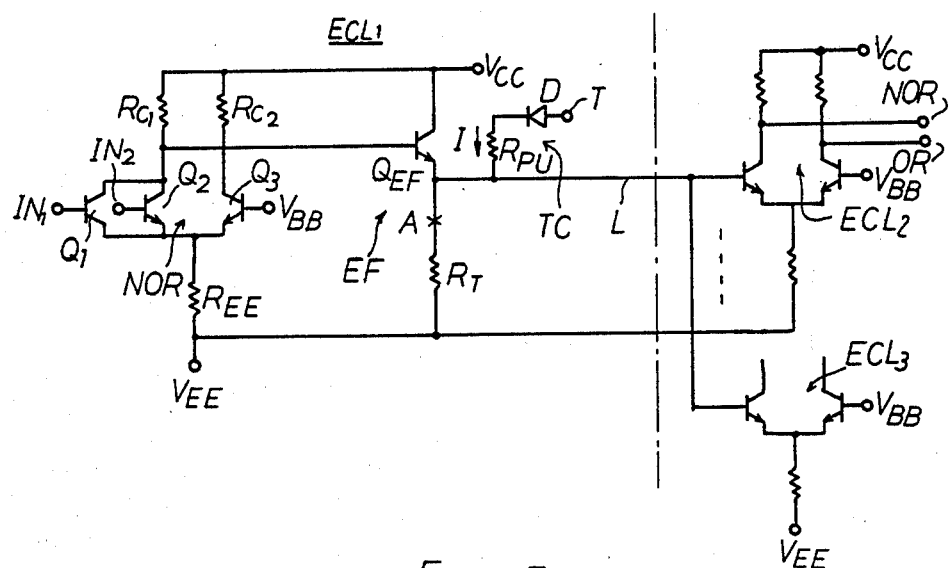
FIGS. 6 and 7 are circuit diagrams of an embodiment of the present invention.

FIG. 6 is a circuit diagram of an embodiment of the present invention, in which $ECL_1$ represents an ECL circuit at the previous stage and $ECL_2$, $ECL_3$, - - - denote ECL circuits (or input stages thereof) at a subsequent stage. ECL circuit $ECL_1$ comprises a NOR gate, including transistors Q1–Q3 having emitters which are connected with one another, collector-resistors $R_{C1}$ and $R_{C2}$ and an emitter-resistor $R_{EE}$, and an emitter-follower circuit EF for extracting an output from the NOR gate. The NOR gate sets an output (or input of transistor $Q_{EF}$) of L level when input $IN_1$ or $IN_2$ is higher than a reference voltage $V_{BB}$ and sets an output of H level when both of the inputs $IN_1$ and $IN_2$ are lower than $V_{BB}$. The emitter-follower circuit EF shifts the voltage of the output of the NOR gate and has the same arrangement as the emitter-follower circuit shown in FIG. 1.

Figure 7:
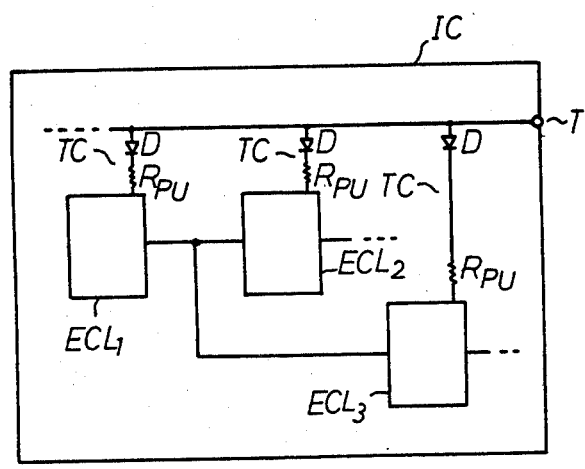

According to the present invention, a testing circuit TC, to which auxiliary current I (smaller than the current usually flowing to the pull-down resistor $R_T$ but larger than the sum of the input currents flowing to ECL circuits $ECL_2$, $ECL_3$, - - - at a subsequent stage) is allowed to flow only at the time of test, is connected to a line L extending from the emitter output of EF transistor $Q_{EF}$ in the ECL circuit $ECL_1$ to ECL circuits $ECL_2$, $ECL_3$, - - - at the subsequent stage. The testing circuit TC employed in this embodiment includes a diode D and a pull-up resistor $R_{PU}$ connected in series between a testing terminal T, having a lead outside an IC chip, and the line L. The diode D serves to prevent the backward flow of current shown in FIG. 6. The testing circuit TC is connected to the output stage of each of the ECL circuits $ECL_1$, $ECL_2$, - - - , as shown in FIG. 7.

The test terminal T is usually connected to a lowest potential $V_{EE}$ or $V_T$ but is connected to a high potential $V_{CC}$, for example, at the time of test. Since the test terminal T is arranged as described above, no current consumption is caused in the testing circuit TC and the ECL circuits are not influenced by one another during the usual operation of the ECL integrated circuit. When the terminal T is connected to $V_{CC}$ at the time of test, the current I tends to flow in accordance with the emitter potential of transistor $Q_{EF}$. If the emitter-follower circuit EF is normal without any disconnection at point A, little or no current I flows when the input of transistor $Q_{EF}$ is at the H level but a large current I flows to the resistor $R_T$ when the input is at the L level. Therefore, the H and L level outputs of ECL circuit $ECL_1$ are transmitted to the subsequent stage as they are.

Figure 3:
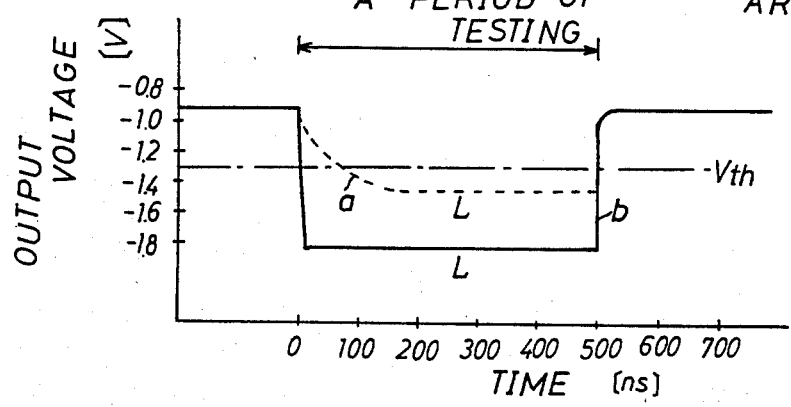

If the emitter-follower circuit EF is disconnected at point A, current I flows to the inputs of the subsequent stage when the input of transistor $Q_{EF}$ is at the L level. Therefore, the output voltage does not drop, as shown in FIG. 3, as time passes, thus allowing the input voltage of the subsequent stage to be kept at the H level. This theoretically indicates malfunction and when specified data DATA is input, the outputs $OUT_1$ and $OUT_2$ are different from the expected values, so that the dynamic function failure of the ECL circuit is detected however low the test frequency may be.

Figure 8:
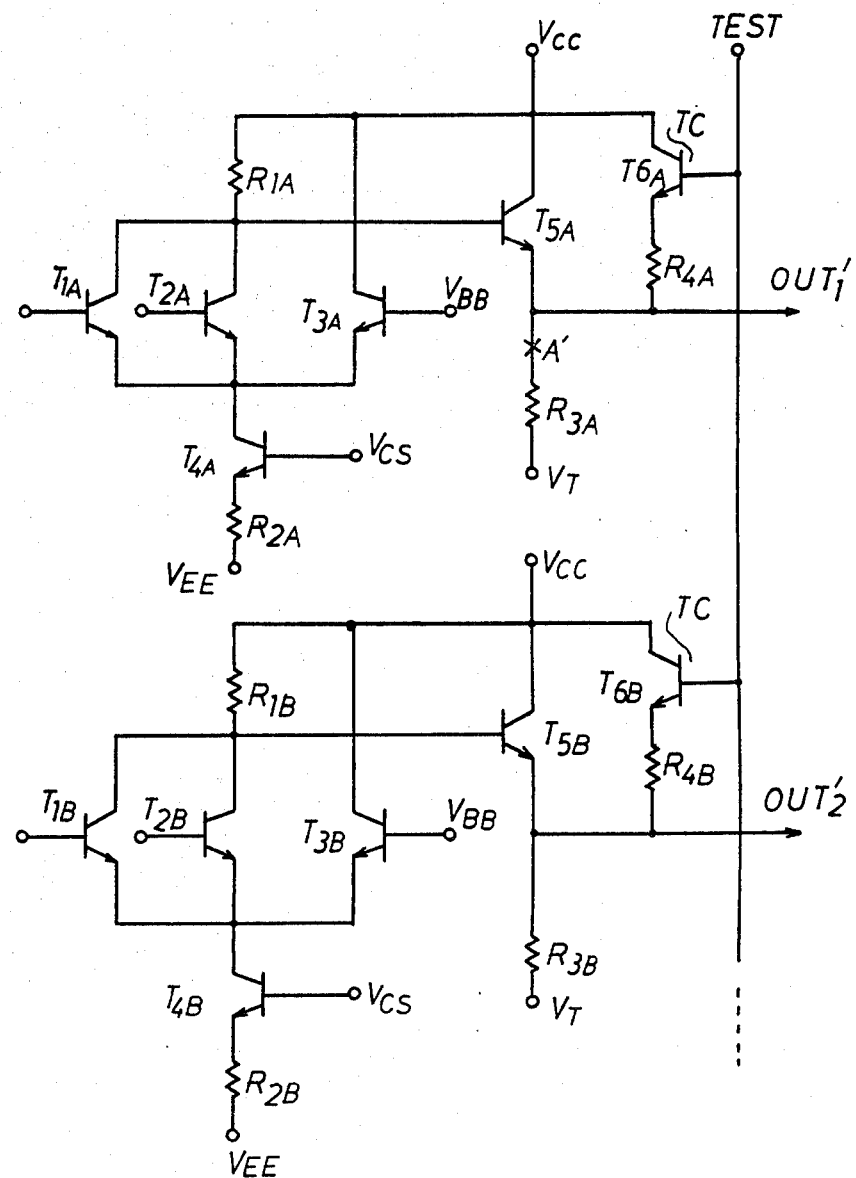
FIG. 8 is a circuit diagram of a second embodiment of the present invention.

FIG. 8 is a circuit diagram of a second embodiment of the present invention employing two input NOR circuits. The bases of transistors $T_{1A}$ and $T_{2A}$ are inputs thereof, and the collectors thereof are connected via a resistor $R_{1A}$ to a power source $V_{CC}$. Collectors thereof are also connected to the base of a transistor $T_{5A}$ whose collector is connected to the power source $V_{CC}$. The emitter of transistor $T_{5A}$ is connected via a resistor $R_{3A}$ to a power source $V_T$ and to an output terminal $OUT_{1'}$. The emitter of a transistor $T_{6A}$, whose collector is connected to the power source $V_{CC}$, is connected via a resistor $R_{4A}$ to the emitter of transistor $T_{5A}$. The emitter of transistor $T_{3A}$, whose collector is connected to the power source $V_{CC}$, is onnnected to the emitters of transistors $T_{1A}$ and $T_{2A}$ and is also connected via a transistor $T_{4A}$ and a resistor $R_{2A}$, to a power source $V_{EE}$. The base of transistor $T_{3A}$ is connected to a power source $V_{BB}$, while to the base of transistor $T_{4A}$ is connected to a power source $V_{CS}$. The power source $V_{CC}$ serves as a power source for supplying operating current, the power source $V_T$ as a terminal power source, the power source $V_{BB}$ as a power source for supplying a reference voltage, and the power source $V_{CS}$ as a power source for applying constant bias voltage to the transistor $T_{4A}$.

The transistor T$_{6A}$ and resistor R$_{4A}$ operate similarly to the diode D and resistor R$_{PU}$ shown in FIG. 6. Namely, when a voltage is applied to a test terminal TEST the voltage of power source V$_{CC}$ is applied to one terminal of resistor R$_{4A}$. A circuit connected to an output terminal OUT$_2'$ has the same arrangement as that connected to the output terminal OUT$_1'$ and the bases of transistors T$_{6A}$ and T$_{6B}$ in these circuits are connected to the test terminal TEST. The circuit shown in FIG. 8 is substantially the same as that shown in FIG. 6 except that the amount of current flowing into the test terminal TEST is different. Namely, current flowing to the resistor is allowed to flow to the test terminal T in FIG. 6, but the amount of current flowing in the second embodiment shown in FIG. 8 may be enough if it reaches about 1 per current amplifying ratio transistor T$_{6A}$ because ON/OFF of transistor is used.

If the second embodiment shown in FIG. 8 is disconnected at a point A', for example, current continues to flow via the transistor T$_{6A}$ and resistor R$_{4A}$ to the output OUT$_1'$ when the input of transistor T$_{5A}$ is at the L level. Therefore, the output voltage does not drop, as shown in FIG. 3, as time passes, thus enabling the input voltage to a subsequent stage to be kept at the H level. A circuit at the subsequent stage is omitted for the clarity of description in the second embodiment shown in FIG. 8.

A description of practical numerical values for the elements of the invention will now be provided.

It is assumed that the power source V$_{CC}$ is 0V or ground voltage, V$_{EE}$ is $-5.2$ V and V$_T$ is $-2.0$ V. The resistor R$_{3A}$ is 2K Ohm, and R$_{4A}$ is 3K Ohm. It is further assumed that the H level V$_{OH}$ is $-0.8$ V and the L level V$_{OL}$ is $-1.2$ V. If the test terminal TEST is at ground potential at the L level output, the current I$_{R3L^*}$ flowing through R$_{3A}$ is as follows:

$$I_{R3L^*} = \frac{1}{R_{3A} + R_{4A}} (-V_{BE(T6A)} - V_T) \approx 0.24 \text{ (mA)}$$

wherein V$_{BE(T6A)}$ represents the voltage between the emitter and base of transistor T$_{6A}$ and is about 0.8 V. If the voltage of terminal TEST is $-2$ V, the current I$_{R3L}$ flowing through R$_{3A}$ at the time of normal operation is:

$$I_{R3L} = \frac{1}{R_{3A}} (V_{OL} - V_T) \approx 0.40 \text{ mA}$$

If the collector current Ic of transistor T$_4$ is 0.3 mA and h$_{FE}$ of the transistor at the subsequent stage is 100, the base current I$_B$ at the subsequent stage is:

$$I_B = \frac{1}{1 + h_{FE}} \times 0.3 \approx 0.003 \text{ mA}$$

If the maximum value of the input connected to the output OUT$_1'$, is 10, the sum of input current at the subsequent stage is 0.03 mA at maximum. Namely, the relation of I$_{R3L}$>I$_{R3L^*}$>0.03 mA is present.

Figure 9:
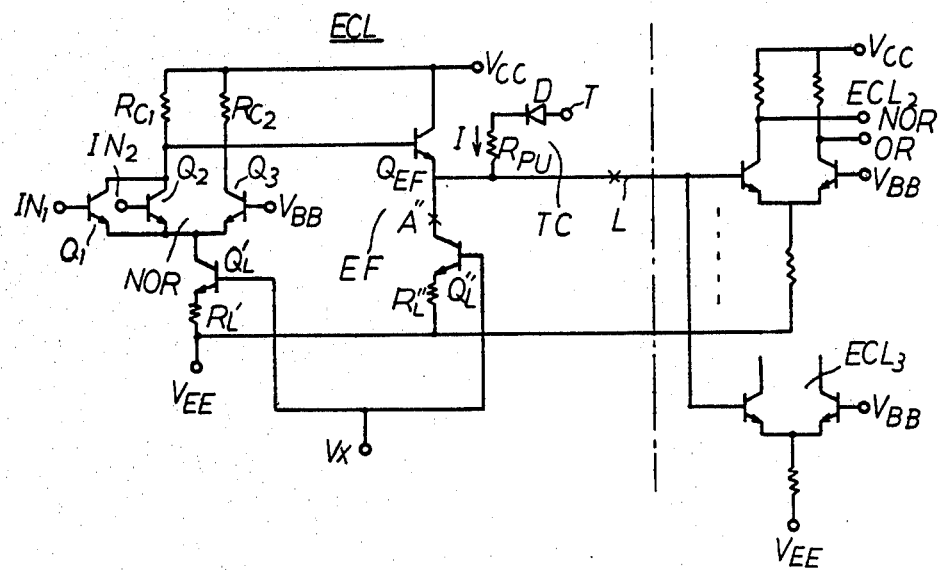
FIG. 9 is a circuit diagram of a third embodiment of the present invention.

FIG. 9 is a circuit diagram of a third embodiment of the present invention. Resistors R$_{EE}$ and R$_T$ are used for the emitter-follower in the first embodiment shown in FIG. 6, but transistor Q$_{L'}$, Q$_{L''}$ and resistors R$_{L'}$, R$_{L''}$ are employed in the third embodiment. The principle according to which the circuit is operated is the same as that in the first embodiment shown in FIG. 6. Bias voltage V$_x$ is applied to the bases of transistors Q$_{L'}$ and Q$_{L''}$ in this case. Both of the resistors R$_{EE}$ and R$_T$ in FIG. 6 are replaced by transistors Q$_{L'}$, Q$_{L''}$ and resistors R$_{L'}$, R$_{L''}$ in FIG. 9, but one of resistors R$_{EE}$ and R$_T$ is used together with any of the transistors Q$_{L'}$, Q$_{L''}$ and resistors R$_{L'}$, R$_{L''}$ in some cases. Namely, the resistor R$_{EE}$ is used together with the transistor Q$_{L''}$ and resistor R$_{L''}$ or the resistor R$_T$ is used together with the transistor Q$_{L'}$ and resistor R$_{L'}$.

Figure 10:
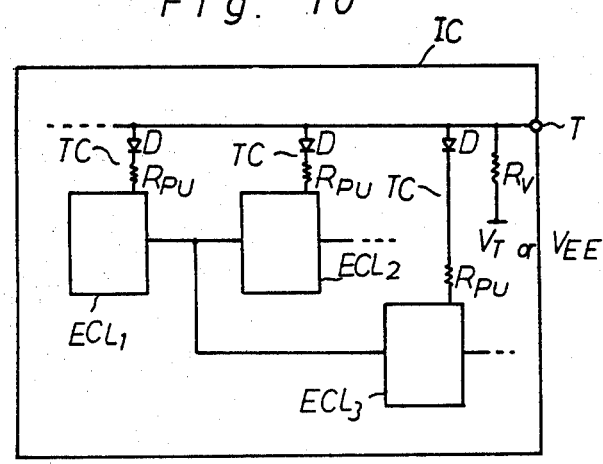
FIG. 10 is a circuit diagram of a fourth embodiment of the present invention.

FIG. 10 is a circuit diagram showing a fourth embodiment of the present invention. In practice, when the circuit shown in FIG. 7 is used, the test terminal T must be connected via a resistor to the power source V$_T$ or V$_{EE}$. The resistor R$_V$ is arranged inside the circuit in the case of the fourth embodiment shown in FIG. 10, thus enabling the operator to use the circuit with the test terminal opened.

According to the present invention as described above, the improper dynamic function of a circuit which will follow a malfunction during normal use can be detected by the function test in which a repeated frequency which is lower than the operating frequency during normal use is employed.

What is claimed is:

1. An ECL integrated circuit comprising:
   at least one ECL circuit having an emitter-follower transistor at the output stage and pull-down means connected to said emitter-follower transistor;
   a subsequent stage connected to the emitter follower transistor;
   a test circuit, connected to the output of said emitter-follower transistor for causing an auxiliary current to flow only at the time of a test, said auxiliary current having a value smaller than the current flowing through said pull-down means but larger than the input current flowing to said subsequent stage during normal operation.

2. An ECL integrated circuit according to claim 1, further comprising first and second power sources, wherein said pull-down means comprises:
   a transistor having a collector connected to said emitter follower transistor, having a base connected to the first power source and having an emitter;
   a resistor connected to the emitter of said transistor and to said second power source.

3. An ECL integrated circuit according to claim 1, wherein said pull-down means comprises a resistor.

4. An ECL integrated circuit according to claim 1, 2 or 3, wherein said test circuit comprises a resistor and a diode connected in series and wherein said resistor is connected to the output of said emitter-follower transistor and to the input of said subsequent stage.

5. An ECL integrated circuit according to claim 1, further comprising a first power source and a test terminal, wherein said test circuit comprises:
   a resistor connected to the output of said emitter follower transistor and the input of said second stage, and
   a transistor having a collector connected to the power source, having an emitter connected to said resistor and having a base connected to said test terminal.

6. An ECL integrated circuit according to claim 1, further comprising a power source, a test terminal and a resistor having a first end connected to said power source and having a second end connected to said test terminal.

7. An ECL integrated circuit comprising:

a plurality of ECL circuits arranged in successive stages, each of which comprises:
a test terminal;
an output stage having an emitter-follower transistor;
a pull-down resistor connected to said emitter-follower transistor; and
a test circuit, connected to the output of said emitter-follower transistor and to a subsequent one of the successive stages, for causing auxiliary current to flow at the time of a testing, said test circuit including a first resistor and a diode connected in series, said diode connected to said test terminal, said first resistor connected to the output of said emitter-follower transistor and to the input of said subsequent one of the successive stages.

8. An ECL integrated circuit connected to a power source comprising:
a plurality of ECL circuits arranged in successive stages, each of which comprises:
a test terminal;
an output stage having an emitter-follower transistor;
a pull-down resistor connected to said emitter-follower transistor;
a test circuit connected to the output of said emitter-follower transistor and to a subsequent one of the successive stages for causing auxiliary current to flow at the time of a testing, said test circuit including a resistor connected to the output of said emitter-follower transistor, and a transistor having a collector connected to the power source, having an emitter connected to said resistor and having a base connected to said test terminal.

9. An ECL integrated circuit according to claim 7, wherein said ECL integrated circuit is connected to a power source, further comprising a second resistor having a first end connected to said test terminal and a second end connected to the power source.

* * * * *

UNITED STATES PATENT AND TRADEMARK OFFICE
CERTIFICATE OF CORRECTION

PATENT NO. : 4,410,816

DATED : October 18, 1983

INVENTOR(S) : Yasunori Kanai

It is certified that error appears in the above-identified patent and that said Letters Patent is hereby corrected as shown below:

Front page, [57] ABSTRACT,, line 5, after "of" insert --the--.
Column 1, line 17, "showing" should be --of--.
Column 2, line 18, after "of" insert --the--;
          line 56, after "level" insert --in--;
          line 67, after "tively," insert --in--.
Column 3, line 40, "in" should be --of--.
Column 4, line 46, delete "N";
          line 58, "onnnected" should be --connected--;
          line 59, after "connected" insert --,--;
          line 62, delete "to" (first occurrence).

Signed and Sealed this

Fourteenth Day of February 1984

[SEAL]

Attest:

GERALD J. MOSSINGHOFF

Attesting Officer

Commissioner of Patents and Trademarks